United States Patent [19]

Kano

[11] Patent Number: 4,667,109
[45] Date of Patent: May 19, 1987

[54] ALIGNMENT DEVICE

[75] Inventor: Ichiro Kano, Yokohama, Japan

[73] Assignee: Canon Kabushiki Kaisha, Tokyo, Japan

[21] Appl. No.: 708,784

[22] Filed: Mar. 6, 1985

[30] Foreign Application Priority Data

Mar. 9, 1984 [JP] Japan ................... 59-43963
Feb. 21, 1985 [JP] Japan ................... 60-33280

[51] Int. Cl.⁴ .............................................. G01B 11/00
[52] U.S. Cl. .................... 250/461.1; 250/458.1; 250/491.1; 356/401
[58] Field of Search ............... 356/153, 51, 373, 375, 356/399–401; 378/34, 35; 250/365, 372, 458.1, 459.1, 461.1, 491.1; 219/121 LM, 121 LY, 121 LZ, 121 LU

[56] References Cited

U.S. PATENT DOCUMENTS 3,420,719 1/1969 Potts .................... 219/121 LZ
3,984,680 10/1976 Smith .................... 378/34
4,085,329 4/1978 McCoy et al. .......... 378/34
4,476,512 10/1984 Sunago et al. ......... 219/121 LZ
4,508,749 4/1985 Brannon et al. ........ 219/121 LM

FOREIGN PATENT DOCUMENTS 0046543 4/1981 Japan .................... 250/461.1

OTHER PUBLICATIONS

Feder et al, *IBM Technical Disclosure Bulletin*, vol. 16, No. 4, Sep. 1973, p. 1306.
Angilello, *IBM Technical Disclosure Bulletin*, vol. 22, No. 6, Nov. 1979, pp. 2510, 2511.
*Webster's New Collegiate Dictionary*, G & C Merriam Company, Springfield, Mass., 1977, p. 664.

*Primary Examiner*—F. L. Evans
*Attorney, Agent, or Firm*—Fitzpatrick, Cella, Harper & Scinto

[57] ABSTRACT

An alignment device having a light source for emitting a light beam in a ultraviolet range or in a short wavelength range to irradiate alignment marks formed on two members to be aligned with each other, and an observation system for observing an image related to the alignment marks of the two members irradiated by the light beam emitted from the light source.

15 Claims, 5 Drawing Figures

ALIGNMENT DEVICE

BACKGROUND OF THE INVENTION

This invention relates to an alignment device and, more particularly, to an alignment device for aligning a reticle with a wafer in the manufacture of semiconductor circuit devices. The invention also relates to an exposure apparatus for use in the manufacture of semiconductor circuit devices, including an alignment device for aligning a reticle with a wafer.

Recent trends of larger capacities of the semiconductor circuit devices, such as integrated circuits, have forced further miniaturization of the circuit patterns. The requirement of further miniaturization can be met by using a shorter wavelength of light for the exposure of semiconductor substrates. For example, in a case of proximity exposure, the resolvable line width is decreased in proportion to the root of the wavelength used, while in a case of projection exposure, the resolvable line width is decreased in proportion to the wavelength used. In view of this, it has been proposed to use a high-power laser such as an excimer laser, as a light source for the exposure of the semiconductor substrates.

The reduction of the resolvable line width of the circuit pattern, as described above, necessarily requires improvements in the accuracy of alignment between the reticle and wafer upon transfer of the pattern of the reticle onto the wafer.

In order to achieve higher alignment accuracies, in a case where the alignment is effected by means of a light beam of a wavelength within a visible range, it would be necessary to make larger the numerical aperture (NA) of the alignment optical system to allow the alignment optical system to take up, among the diffractively reflected light rays from the alignment mark, the light rays of the diffraction orders from low to higher. By this, the output level of alignment signals will be increased, so that higher alignment accuracies will be attainable. However, this requires a substantial structural change of the alignment optical system.

Examples of the wavelengths conventionally used for the alignment beam in the visible range are a wavelength 546 nm (Hg lamp), a wavelength 633 nm (He-Ne laser), a shorter wavelength 436 nm (Hg lamp), a wavelength 405 nm (Hg lamp), a wavelength 442 nm (He-Cd laser), etc. With the alignment beam as above, manual alignment through a microscopic observation system and/or auto-alignment through a TV camera are carried out.

If, on the other hand, an alignment beam in the ultraviolet (UV) range is used to improve the alignment accuracies, the manual alignment through the microscopic observation system is nullified because the ultraviolet light is out of the visible range. Further, ordinary TV cameras do not have sensitivities to the ultraviolet range, so that a special image pickup device is required to achieve the auto-alignment.

When, on the other hand, the alignment is to be effected by a laser beam having a wavelength which is at an end portion of the visible range on the shorter wavelength side, such as the laser beam of the He-Cd laser, it is necessary for the manual alignment through the microscopic observation system to amplify the intensity of the alignment beam because the sensitivity of human eyes to the He-Cd laser is poor.

SUMMARY OF THE INVENTION

It is accordingly a primary object of the present invention to provide an improved alignment device having a higher alignment accuracy It is another object of the present invention to provide an improved alignment device wherein an alignment beam in the ultraviolet range or in the short wavelength range is used to assure a higher alignment accuracy.

It is a further object of the present invention to provide an improved alignment and exposure apparatus for use in the manufacture of semiconductor circuit devices and having an increased alignment accuracy and therefore an increased resolving power.

Briefly, according to the present invention, there is provided an alignment device having a light source for emitting a light beam in an ultraviolet range or in a short wavelength range to irradiate aligment marks formed on two members to be aligned with each other, and an observation system for observing an image related to the alignment marks of the two members irradiated by the light beam emitted from the light source.

According to another aspect of the present invention, there is provided an alignment and exposure apparatus having a common laser as a light source for providing an alignment beam and as a light source for providing exposure beam. In a preferred form, the laser comprises an excimer laser.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
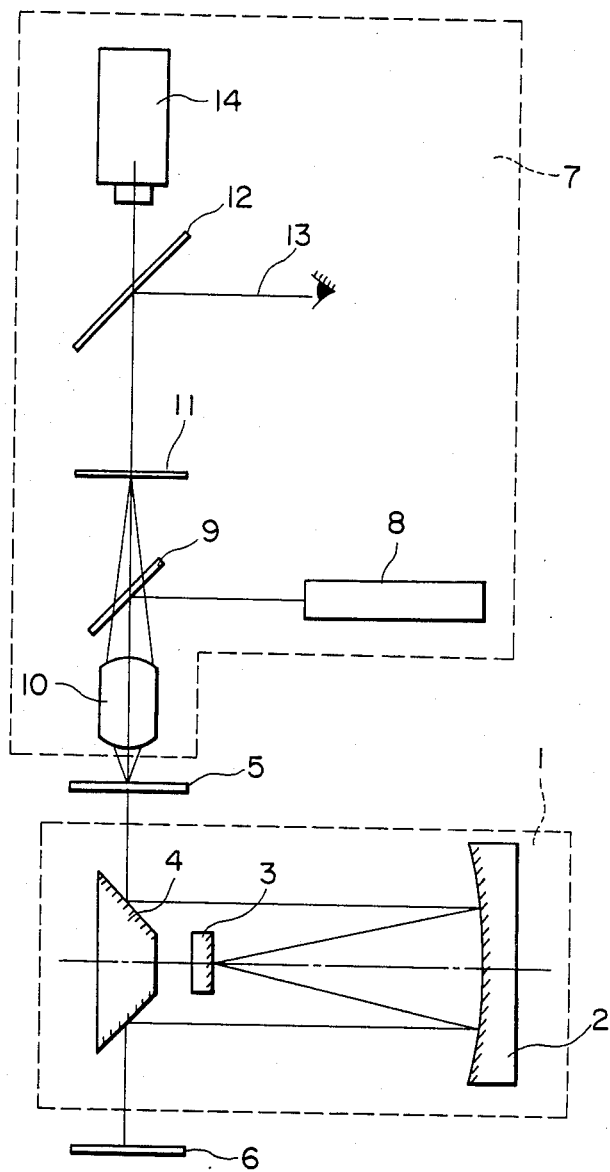
FIG. 1 is a schematic view showing an alignment device according to an embodiment of the present invention, which is applied to a mirror-reflection type projection exposure apparatus.

FIG. 1 shows an alignment device according to an embodiment of the present invention, which is applied to a mirror-reflection type projection exposure apparatus. The exposure apparatus is arranged to use a deep UV (ultraviolet) ray as the exposure beam. The exposure apparatus includes a deep UV projection optical system 1 comprising a concave mirror 2, a convex mirror 3 and a path-bending mirror 4. When a reticle or mask 5 is irradiated by the exposure beam emitted from an unshown UV light source, the circuit pattern formed on the mask 5 is transferred by the projection optical system 1 onto a wafer 6. Prior to the pattern transfer onto the wafer 6, the mask 5 and wafer 6 are aligned with each other by an alignment microscopic system 7, with the use of alignment marks formed on the mask 5 and wafer 6.

In the FIG. 1 arrangement, when the alignment between the mask 5 and wafer 6 is completed, the alignment microscopic system 7 is retracted from the FIG. 1 position and an unshown exposure illumination system including the UV light source is placed in substitution for the alignment microscopic system.

The alignment microscopic system 7 includes a light source 8 for providing an alignment beam, a beam splitter 9 disposed in the path of the alignment beam emitted from the light source 8, and a UV objective lens 10 disposed in the path of the light beam reflected by the beam splitter 9. In the present embodiment, the light source 8 comprises an excimer laser emitting a laser beam of a wavelength in the UV range. The light source 8 may be an He-Cd laser emitting a laser beam of a wavelength in a short wavelength region. In this Specification, the term "ultraviolet (UV) range" means a wavelength region less than approx. 400 nm, and the term "short wavelength range" means a wavelength region not less than approx. 400 nm and not greater than approx. 450 nm.

The alignment beam emerging from the objective lens 10 is incident on the mask 5, and a portion of the incident light is reflected by the mask 5 back to the objective lens 10. The remaining portion of the light incident on the mask 5 passes therethrough and is incident on the wafer 6 via the projection optical system 1. At least a portion of the light beam incident on the wafer 6 is reflected thereby along its oncoming path so that it enters again the objective lens 10. The reflected light from the mask 5 and the wafer 6 passes through the objective lens 10 and then passes through the beam splitter 9.

The light beam transmitted through the beam splitter 9 is focused on a fluorescent screen or plate 11 which is disposed in an image plane, on the enlargement side, of the objective lens 10. The light beam emitted by the fluorescent plate 11 is incident on another beam splitter 12 by which it is split into two, one is reflected thereby to an eye-observation system 13 while the other is transmitted therethrough to a TV camera 14.

Figure 2A:
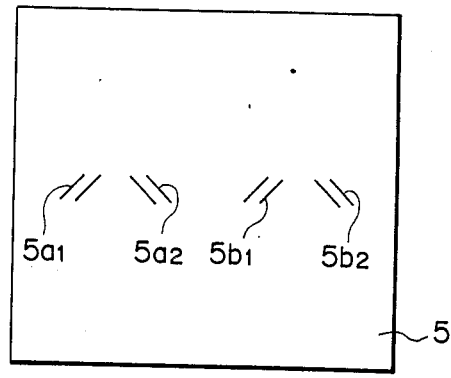
FIG. 2A is a plan view showing an example of mask having formed thereon alignment marks.
Figure 2B:
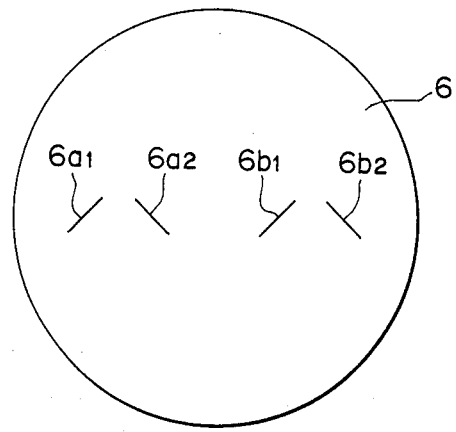
FIG. 2B is a plan view showing an example of a wafer having formed thereon alignment marks.

As shown in FIGS. 2A and 2B, each of the mask 5 and wafer 6 has formed thereon a pair of alignment marks $5a_1$, $5a_2$; $5b_1$, $5b_2$ ($6a_1$, $6a_2$; $6b_1$, $6b_2$) in order to detect any positional deviation between the mask and wafer in the rotational direction. Although only each one is shown in FIG. 1, the alignment microscopic system 7 actually has a pair of beam splitters such as 9, a pair of objective lenses such as 10, a pair of fluorescent plates such as 11, a pair of beam splitters such as 12, a pair of eye-observation systems 13, and a pair of TV cameras such as 14, for the purpose of detection of the pair of alignment marks. The unshown components of the alignment microscopic system 7 are disposed, in the present embodiment, behind the corresponding elements as viewed in FIG. 1. The alignment beam emitted by the light source 8 is divided by an unshown beam-dividing prism or the like so that the split beams are directed to the pair of beam splitters 9, 9. The pair of TV cameras 14, 14 may be replaced by a single TV camera which is arranged to combine the observation viewfields for the pair of alignment marks.

With the above arrangement, the alignment beam emerging from the light source 8 is reflected by the beam splitter 9 toward the objective lens 10, so that the alignment marks formed on the mask 5 and wafer 6 are irradiated by the alignment beam. When the alignment beam from the light source 8 is incident on the alignment marks sequentially, the alignment beam is reflected by each of the bar-elements $5a_1$–$5b_2$ and $6a_1$–$6b_2$ shown in FIGS. 2A and 2B, while it is transmitted through the area other than the bar-elements. The light beams reflected by the bar-elements of the alignment marks are incident on the fluorescent plate 11 via the objective lens 10 and beam splitter 9. Since the fluorescent plate 11 is located at a position which is optically conjugate with the mask 5 and wafer 6, images of the alignment marks of the mask 5 and wafer 6 are formed on the fluorescent plate 11 at an enlarged ratio by the objective lens 10.

When the excimer laser is used as the light source 8, the light beam in the UV range is converted or shifted by the fluorescent plate 11 into a wavelength of light in the visible range. The thus converted light into the visible range is directed to the eye-observation system 13 and the TV camera 14 through the beam splitter 12. The images as observed by the eye-observation system 13 are used for the purpose of manual alignment, while the images as picked up by the TV camera 14 are used for the purpose of auto-alignment.

Detailes of the alignment will now be described with reference to FIGS. 2A-2C. As shown in FIG. 2A, the mask 5 has formed thereon bar-elements $5a_1$ and $5b_1$ each comprising two parallel bars inclined at an angle of 45 degrees with respect to the horizontal, and bar-elements $5a_2$ and $5b_2$ each comprising two parallel bars inclined in the direction perpendicular to the bar-elements $5a_1$ and $5b_1$. The bar-elements $5a_1$ and $5a_2$ constitute one of the pair of alignment marks, while the bar-elements $5b_1$ and $5b_2$ constitute the other of the alignment marks.

On the other hand, the wafer 6 as shown in FIG. 6 has formed thereon bar-elements $6a_1$–$6b_2$ each comprising a single bar. The bar-elements $6a_1$ and $6b_1$ are parallel to each other, while the bar-elements $6a_2$ and $6b_2$ are parallel to each other and extend in the directions orthogonal to the directions of the bar-elements $6a_1$ and $6b_1$. The bar-elements $6a_1$ and $6a_2$ constitute one of the pair of alignment marks, which corresponds to the alignment mark on the mask 5 comprising the bar-elements $5a_1$ and $5a_2$, while the bar-elements $6b_1$ and $6b_2$ constitute the other of the alignment marks which corresponds to the alignment mark on the mask 5 comprising the bar-elements $5b_1$ and $5b_2$.

Upon manual alignment through the eye-observation system 13, the mask 5 and wafer 6 are displaced relative to each other so as to locate each of the bar-elements $6a_1$–$6b_2$ of the wafer 6 at a position approximately in the midst of two bars of the corresponding one of the bar-elements $5a_1$–$5b_2$ of the mask 5.

Figure 2C:
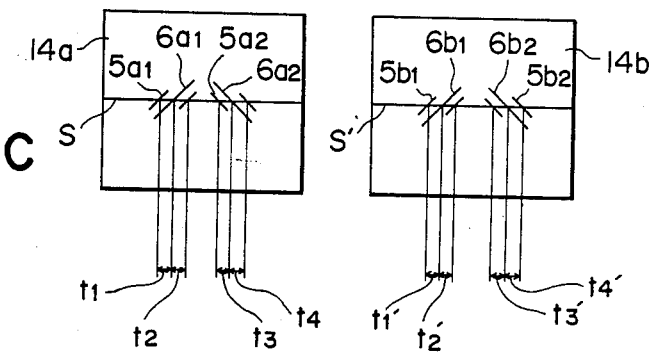
FIG. 2C is a view for illustrating the alignment operation relative to the alignment marks formed on the mask and wafer of FIGS. 2A and 2B.

In the auto-alignment through the TV cameras 14, 14, the images of the alignment marks of the mask 5 and wafer 6 as picked up by the TV cameras are electrically scanned along the TV scanning lines S and S' such as shown in FIG. 2C and intervals or times $t_1$, $t_2$, $t_3$, $t_4$, $t_1'$, $t_2'$, $t_3'$ and $t_4'$ with respect to the scan are detected. If the times $t_1$–$t_4'$ are not equal to each other, a position correcting signal corresponding to the inequality is produced, so that the times $t_1$–$t_4'$ are finally regularized.

With the use of an aligment beam in the UV range or short wavelength range, as has hitherto been described, the diffraction angle at each of the diffraction orders of the light rays diffractively reflected by each of the elements of the alignment marks can be made smaller. This allows an alignment optical system of a particular numerical aperture (NA) to receive the diffracted rays of the diffraction orders from low to higher. As the result, the proportion of the diffracted rays which can be received by the alignment optical system increases. Therefore, the output level of the alignment signal is increased, which assures alignment of higher accuracies.

Figure 3:
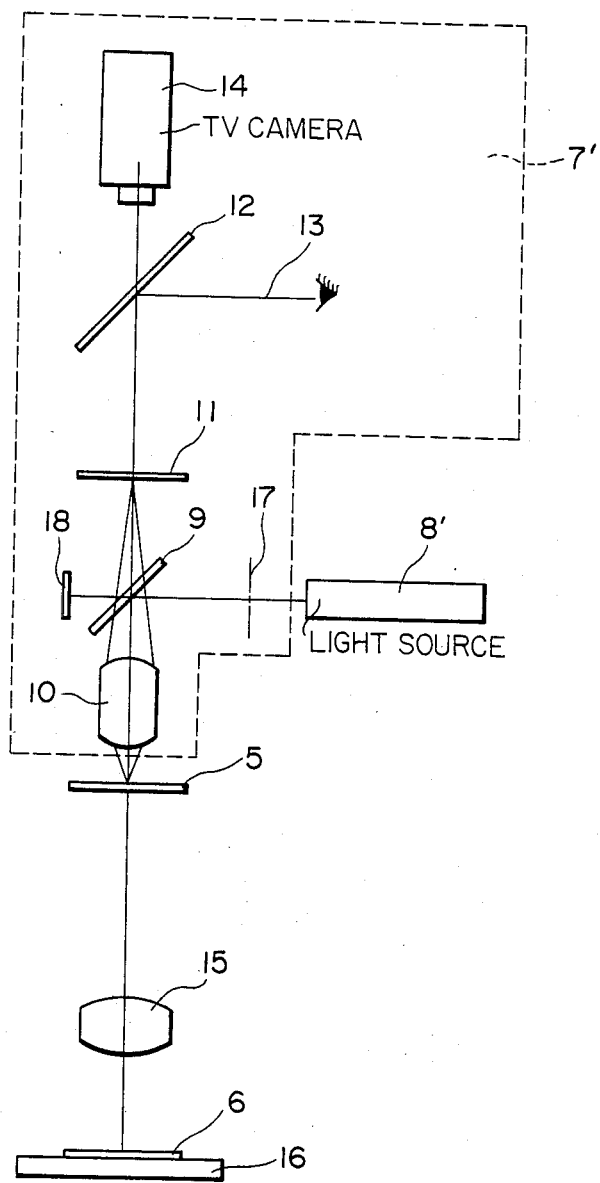
FIG. 3 is a schematic view showing an alignment and exposure apparatus of the lens projection type, according to an embodiment of the present invention.

FIG. 3 shows an alignment and exposure apparatus of reduction projection type, called a stepper, for use in the manufacture of semiconductor circuit devices, into which apparatus the present invention is applied.

Elements of the present embodiment corresponding to those of FIG. 1 embodiment are denoted by corresponding reference numerals. Denoted in FIG. 3 by reference numeral 8' is a light source which comprises an excimer laser. The light source 8' is commonly used as a light source for emitting an alignment beam and as a light source for emitting an exposure beam. The exposure apparatus includes an alignment microscopic system 7' which, as in the FIG. 1 embodiment, is arranged to be replaced by an unshown exposure illumination system upon exposure of a wafer 5. The exposure apparatus further includes a projection lens 15 which is effective to project a pattern of a mask 5 onto the wafer 6 at a reduced magnification. The wafer 6 is carried by a wafer carriage 16 which is movable in a plane perpendicular to the optical axis of the projection lens 15.

Since, in the present embodiment, the light source 8' is commonly used both for the alignment and for the exposure, various advantageous effects in respect to cost, space, etc. are attainable as compared with a case where separate light sources are provided for the alignment and the exposure. Further, the alignment beam and the exposure beam have exactly the same wavelength. Therefore, it is not necessary to take into account the chromatic aberration of the lens 15.

The exposure apparatus further includes a light blocking member 17 having a light-transmitting window. The light blocking member 17 is provided in order that only the alignment mark areas on the mask 5 and wafer 6 are irradiated by the alignment beam emitted by the light source 8'. Denoted by reference numeral 18 is an additional fluorescent plate to be used for the purpose of confirmation of emission of the light source 8' and for the purpose of axis-aligning of the light source 8'. A beam splitter 9 is disposed in the path of the laser beam emerging from the light source 8' to split the laser beam into two light beams. The fluorescent plate 18 is located at a desired position to receive the laser beam transmitted through the beam splitter 9. The other of the split light beams as reflected by the beam splitter 9 is used as the alignment beam.

When the position of the light source 8' is to be adjusted relative to the common optical axis of an objective lens 10 and the projection lens 15, an unshown pin-hole plate is fixedly secured in front of the light emitting portion of the light source 8' and then the position of the light source 8' is adjusted so that the laser beam passing through the pin-hole formed in the pin-hole plate is incident on the intersection of cross hairs formed on the surface of the fluorescent plate 18.

The fluorescent plate 18 is also used for the purpose of confirmation of emission of the light source 8' during exposure operation.

It will be understood that the light blocking member 17 and the fluorescent plate 18 are applicable to the FIG. 1 embodiment. Further, the present invention is not limited to exposure apparatuses of projection type and is also applicable to exposure apparatuses of contact type, proximity type.

In accordance with the present invention, as has hitherto been described, an alignment beam in the UV range or the short wavelength range can be used without any difficulties which are encountered by the prior art alignment devices. Therefore, the alignment accuracy can be improved easily. Particularly, in the case of using UV rays as the alignment beam, the UV rays themselves can not be observed by human eyes. Therefore, use of a shorter wavelength of light for the purpose of improving the alignment accuracy disadvantageously nullifies the manual alignment by the naked eye observation, without the present invention. As compared therewith, use of fluorescent plate 11 of the present invention allows the manual alignment irrespective of use of the short wavelength of light. Since the fluorescent plate 11 is disposed in the image plane, at the enlargement side, of the objective lens 10, any decrease in the resolution due to the presence of the fluorescent plate can be neglected.

In a case where a TV camera is used for auto-alignment, the image pickup tube usually has no sensitivity to the short wavelength. For this reason, without the present invention, the auto-alignment is impossible unless a special image pickup device having a sensitivity to the short wavelength is employed. As compared therewith, the fluorescent plate 11 of the present invention converts or shifts the UV image into a visible image, so that a sufficient level of detection by the image pickup tube is assured. Accordingly, improved alignment accuracies owing to the shorter wavelength are in fact attainable.

It will be understood that the fluorescent plate used in the alignment device may of course be replaced by an image pickup device having a sensitivity relative to the UV range. In such case, images of the alignment marks are directly formed on the image pickup device by which the images are visualized electrically through the image pickup device.

Where a laser beam in the short wavelength range, such as He-Cd laser, is used as the alignment beam, the sensitivity of human eye to such laser beam is poor as described in the foregoing. With the present invention, however, the fluorescent plate is used to convert or shift the light beam of short wavelength into a light beam in the visible range. By this, inconveniences which are encountered by the prior art alignment devices, particularly upon the manual alignment, are fully eliminated.

While the invention has been described with reference to the structures disclosed herein, it is not confined to the details set forth and this application is intended to cover such modifications or changes as may come within the scope of the following claims.

What is claimed is:

1. An alignment device, comprising:
   a light source for illuminating alignment marks formed on two members which are to be aligned with each other, said light source emitting a light beam of a wavelength in a short wavelength range;
   imaging means for forming images of the alignment marks of the two members illuminated by said light source; and
   means for converting the wavelength of the light rays constituting the images formed by said imaging means to light rays of a longer wavelength.

2. A device according to claim 1, wherein said converting means is disposed in an image plane of said imaging means.

3. A device according to claim 2, wherein said imaging means forms an enlarged image of each of the alignment marks.

4. A device according to claim 1, wherein said converting means comprises a fluorescent plate.

5. A device according to claim 1, wherein said light source comprises an excimer laser.

6. An alignment and exposure apparatus for use with a mask and a wafer having alignment marks, respectively, for the manufacture of semiconductor circuit devices, said apparatus comprising:

an excimer laser for irradiating the mask to transfer a pattern of the mask onto the wafer, said excimer laser emitting a laser beam having a wavelength;

imaging means for forming images of the alignment marks of the mask and the wafer irradiated by the laser beam from said excimer laser; and means for converting the wavelength of the laser light constituting the images of the alignment marks of the mask and the wafer to a longer wavelength, said converting means being disposed at a position optically conjugate with each of the mask and the wafer.

7. An apparatus according to claim 6, wherein said converting means comprises a fluorescent plate.

8. An apparatus according to claim 6, further comprising a projection optical system for transferring the pattern of the mask onto the wafer.

9. An apparatus according to claim 8, wherein said projection optical system is a reflection type projection optical system.

10. An apparatus according to claim 8, wherein said projection optical system is a refraction type projection optical system.

11. An apparatus according to claim 10, wherein said projection optical system is a reduction projection type projection optical system.

12. An alignment device, comprising:

a light source for illuminating alignment marks formed on two members which are to be aligned with each other, said light source emitting light of a wavelength in an invisible wavelength range;

imaging means for forming images of the alignment marks of the two members illuminated by said light source; and means for converting to a visible wavelength the wavelength of the light constituting the images of the alignment marks that are formed by said imaging means.

13. A device according to claim 12, wherein said converting means is disposed in an image plane of said imaging means.

14. A device according to claim 12, wherein said converting means comprises a fluorescent plate.

15. A device according to claim 12, wherein said light source comprises an excimer laser.

* * * * *